US009178554B2

(12) United States Patent
Mccarthy et al.

(10) Patent No.: US 9,178,554 B2
(45) Date of Patent: Nov. 3, 2015

(54) PHASE CORRECTION APPARATUS AND METHOD

(71) Applicant: FutureWei Technologies, Inc., Plano, TX (US)

(72) Inventors: Daniel Mccarthy, Elk Grove Village, IL (US); Michael Bushman, Hanover Park, IL (US); Lawrence Connell, Naperville, IL (US)

(73) Assignee: Futurewei Technologies, Inc., Plano, TX (US)

( * ) Notice: Subject to any disclaimer, the term of this patent is extended or adjusted under 35 U.S.C. 154(b) by 29 days.

(21) Appl. No.: 14/228,474

(22) Filed: Mar. 28, 2014

(65) Prior Publication Data

US 2015/0280762 A1  Oct. 1, 2015

(51) Int. Cl.
*H01B 12/06* (2006.01)
*H04B 1/18* (2006.01)
*H03H 11/20* (2006.01)
*H04L 7/00* (2006.01)
*H04L 7/033* (2006.01)

(52) U.S. Cl.
CPC ............... *H04B 1/18* (2013.01); *H03H 11/20* (2013.01); *H04L 7/0079* (2013.01); *H04L 7/033* (2013.01)

(58) Field of Classification Search
USPC ............ 455/67.1, 67.14, 114.1, 114.2, 114.3, 455/231.1, 255, 256, 257, 313, 317, 318, 455/323, 326; 331/117 R, 117 FE, 158; 327/112, 117, 118
See application file for complete search history.

(56) References Cited

U.S. PATENT DOCUMENTS

| 4,982,108 | A | 1/1991 | Connell et al. |
| 5,949,259 | A | 9/1999 | Garcia |
| 7,123,112 | B2 * | 10/2006 | Kang et al. ............... 331/117 FE |
| 2009/0111414 | A1 * | 4/2009 | Sahota et al. ............... 455/232.1 |
| 2009/0284288 | A1 * | 11/2009 | Zhang et al. ................... 327/118 |
| 2012/0149321 | A1 * | 6/2012 | Montalvo et al. ............. 455/326 |
| 2014/0035689 | A1 * | 2/2014 | Ozawa et al. ................. 331/158 |

FOREIGN PATENT DOCUMENTS

| CN | 1243616 A | 2/2000 |
| CN | 1812263 A | 8/2006 |
| CN | 101937639 A | 1/2011 |
| EP | 1684430 A1 | 7/2006 |

OTHER PUBLICATIONS

International Search Report and Written Opinion of Patent Cooperation Treaty (PCT), Application No. PCT/CN2015/074999, Applicant: Huawei Technologies Co., Ltd., date of mailing Jul. 1, 2015, 12 pages.
Ping-Jian, L., et al., "Nanoelectronic logic circuits with carbon nanotube transistors," Acta Physica Sinica, vol. 56, No. 2, Feb. 2007, pp. 1054-1060.

* cited by examiner

*Primary Examiner* — Thanh Le
(74) *Attorney, Agent, or Firm* — Slater & Matsil, L.L.P.

(57) ABSTRACT

A method for differential buffer phase correction comprises generating a pair of differential signals from a local oscillator, applying one of the signals to a first inverter and the other signal to a second inverter of a buffer through a differential pair of lines, applying a first positive feedback signal to the first inverter through a first feedback capacitor, wherein the first positive feedback signal is generated from an output of the second inverter and applying a second positive feedback signal to the second inverter through a second feedback capacitor, wherein the second positive feedback signal is generated from an output of the first inverter.

20 Claims, 5 Drawing Sheets

PHASE CORRECTION APPARATUS AND METHOD

TECHNICAL FIELD

The present invention relates to a phase correction apparatus, and more particularly, to a phase correction apparatus for correcting the phase imbalance of a differential buffer of a quadrature generator.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of standards such as the main $2^{nd}$-Generation (2G) technology Global System for Mobile Communications (GSM), the main $3^{rd}$-Generation (3G) technology Universal Mobile Telecommunications System (UMTS) and the main $4^{th}$-Generation (4G) technology Long Term Evolution (LTE).

A wireless network may include a wireless device and a plurality of base stations. The wireless device may be a notebook computer, a mobile phone or a Personal Digital Assistant (PDA), a media player, a gaming device or the like. The base stations communicate with the wireless device over a plurality of wireless channels coupled between the wireless device and the base stations (e.g., a downlink channel from a base station to a wireless device). The wireless device may send back information, including channel information, to the base stations over a plurality of feedback channels (e.g., an uplink channel from the wireless device to the base station).

The wireless device may include a transceiver coupled between an antenna and a baseband processor. The transceiver may comprise a first mixer coupled to a local oscillator. The mixer generates a signal at an intermediate frequency suitable for the baseband processor. After being processed by the first mixer, an in-phase (I) signal having the intermediate frequency is generated and sent to the baseband processor.

The transceiver further comprises a second mixer coupled to the local oscillator through a phase shifter. The phase shifter adds a 90 degree phase shift to the signal generated by the local oscillator. The second mixer generates a quadrature (Q) signal for digital signal processing in the baseband processor.

SUMMARY OF THE INVENTION

These and other problems are generally solved or circumvented, and technical advantages are generally achieved, by preferred embodiments of the present invention which provide a system, apparatus and method for improving the phase balance of a differential buffer of a quadrature generator.

In accordance with an embodiment, an apparatus comprises a first inverter coupled between a first input terminal and a first output terminal, wherein the first inverter comprises a first transistor and a second transistor connected in series between a power supply and ground, wherein a first gate of the first transistor and a second gate of the second transistor are connected to an input of the first inverter, a second inverter coupled between a second input terminal and a second output terminal, a first feedback capacitor coupled between the input of the first inverter and the second output terminal and a second feedback capacitor coupled between an input of the second inverter and the first output terminal.

In accordance with another embodiment, a system comprises a mixer configured to receive a radio frequency signal from an antenna and a frequency translating signal from a local oscillator and a buffer coupled to the mixer and connected to the local oscillator through a differential pair of lines.

The buffer comprises a first inverter formed by two transistors connected in series, a first resistor coupled between an input of the first inverter and an output of the first inverter, a first input capacitor coupled between a first input terminal of the buffer and the input of the first inverter, a second inverter formed by two transistors connected in series, a second resistor coupled between an input of the second inverter and an output of the second inverter, a second input capacitor coupled between a second input terminal of the buffer and the input of the second inverter, a first feedback capacitor coupled between the input of the first inverter and the output of the second inverter and a second feedback capacitor coupled between the input of the second inverter and the output of the first inverter.

In accordance with yet another embodiment, a method comprises generating a differential pair of signals from a local oscillator, wherein the differential pair of signals includes a first signal and a second signal, applying the first signal and the second signal to a first inverter and a second inverter of a buffer respectively through a differential pair of lines, applying a first positive feedback signal to the first inverter through a first feedback capacitor, wherein the first positive feedback signal is generated from an output of the second inverter and applying a second positive feedback signal to the second inverter through a second feedback capacitor, wherein the second positive feedback signal is generated from an output of the first inverter.

An advantage of a preferred embodiment of the present invention is correcting a phase mismatch between two inverters of a differential buffer of a quadrature generator through two feedback capacitors.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a phase correction apparatus for correcting the phase imbalance of a differential buffer of a quadrature generator. The invention may also be applied, however, to a variety of radio frequency devices. Hereinafter, various embodiments will be explained in detail with reference to the accompanying drawings.

Figure 1:
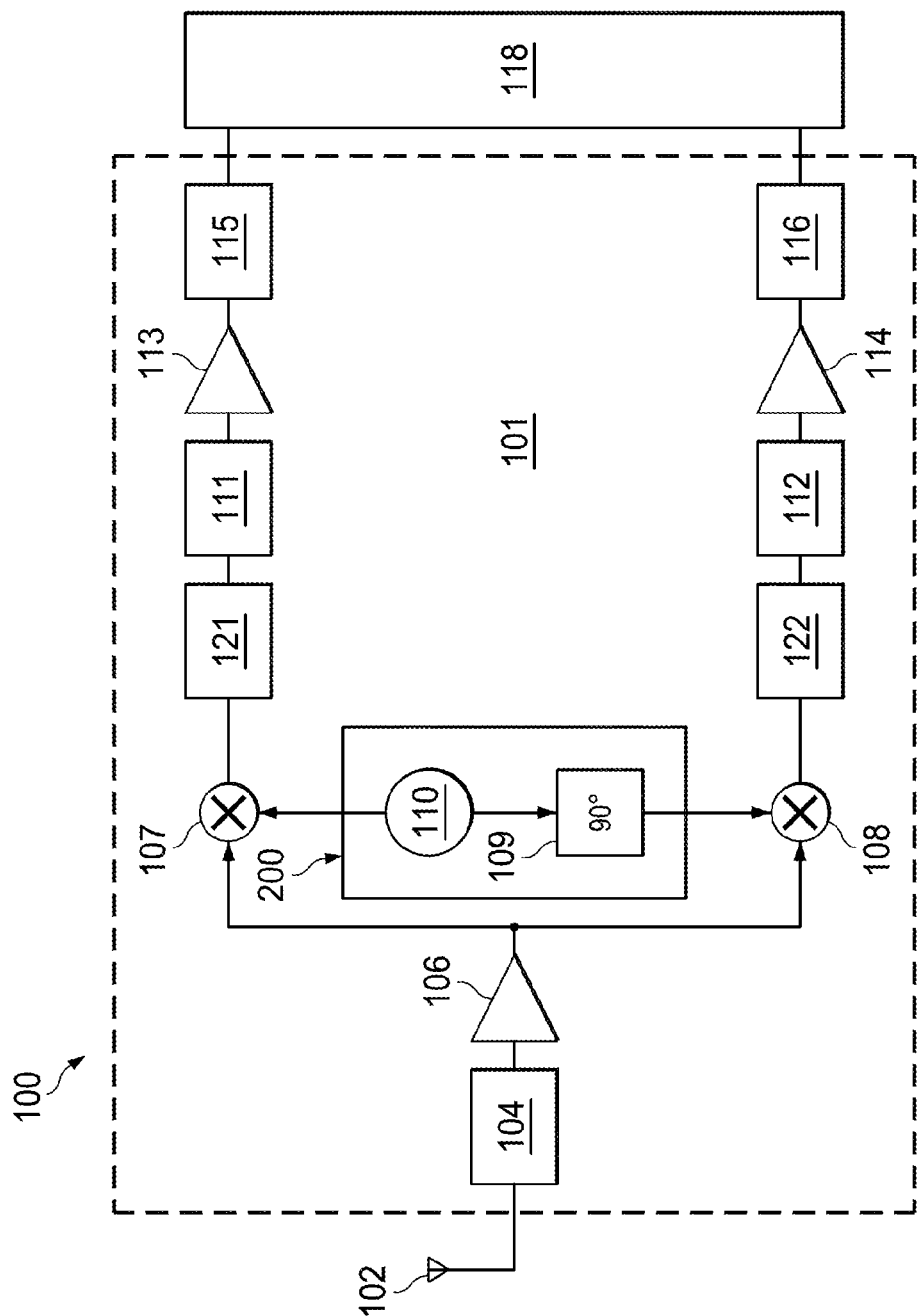
FIG. 1 illustrates a block diagram of a mobile device in accordance with various embodiments of the present disclosure.

FIG. 1 illustrates a block diagram of a mobile device in accordance with various embodiments of the present disclosure. The mobile device 100 may be a notebook computer, a mobile phone or a Personal Digital Assistant (PDA), a media player, a gaming device and/or the like. The mobile device 100 may comprise a receiver 101, a transmitter, antennas and other suitable components. Alternatively, the mobile device may comprise a transceiver in which both a transmitter and a receiver are combined and share common circuitry. For simplicity, only the detailed structure of the receiver 101 is shown in FIG. 1.

The receiver 101 is coupled between an antenna 102 and a baseband processor 118. While FIG. 1 shows a single antenna, the antenna 102 may include two antennas, namely a primary antenna and a secondary antenna. The primary antenna is configured to transmit outbound wireless signals from the mobile device to a base station or receive inbound wireless signals from the base station. The secondary antenna, as an auxiliary antenna, may not be able to transmit high performance outbound signals from the mobile device to the base station. The main function of the secondary antenna is receiving diversity wireless signals. A mobile device having two antennas is well known in the art, and hence is not discussed in further detail herein to avoid repetition.

The mobile device 100 may transmit and receive wireless signals modulated based upon various standards such as such as the main $2^{nd}$-Generation (2G) technology Global System for Mobile Communications (GSM), the main $3^{rd}$-Generation (3G) technology Universal Mobile Telecommunications System (UMTS) and the main $4^{th}$-Generation (4G) technology Long Term Evolution (LTE). In addition, the wireless signals may be modulated based upon other standards such as Worldwide Interoperability for Microwave Access (WiMAX), Wireless Local Area Network (WLAN), Ultra Wideband (UWB) and/or the like.

The processor 118 may be any suitable baseband processors such as a digital signal processor (DSP) chip and/or the like. The processor 118 is employed to manage radio frequency functions and provide control software for radio communication. The processor 118 may be further coupled to other mobile device function units such as an application processor and/or the like.

As shown in FIG. 1, the receiver 101 may comprise a plurality of filters such as a first filter 104, an I-channel filter 111 and a Q-channel filter 112. The receiver 101 may further comprise a plurality of gain stages such as a low noise amplifier 106, an I-channel amplifier 113 and a Q-channel amplifier 114. In order to provide digital signals suitable for the processor 118, a plurality of analog-to-digital (A/D) converters 115 and 116 are employed as shown in FIG. 1. The functions of the filters, amplifiers and A/D converters described above are well known, and hence are not discussed in further detail herein.

A first mixer 107 is coupled to a local oscillator 110. The local oscillator 110 generates a signal at a frequency suitable for driving the mixer which then translates an RF input signal to an intermediate frequency suitable for the processor 118. In some embodiments, the signal generated by the local oscillator 110 is a 25% duty cycle signal. After being processed by the first mixer 107, an in-phase (I) signal having the intermediate frequency is generated and sent to the processor 118.

Likewise, a second mixer 108 is coupled to the local oscillator 110 through a phase shifter 109. The phase shifter 109 adds a 90 degree phase shift to the signal generated by the local oscillator 110. The second mixer 108 generates a quadrature (Q) signal for digital signal processing in the processor 118.

Throughout the description, the channel the in-phase signal passes through is alternatively referred to as an I-channel of the receiver 101. Likewise, the channel the quadrature signal passes through is alternatively referred to as a Q-channel of the receiver 101. As shown in FIG. 1, the I-channel and the Q-channel may be of a same configuration.

Figure 2:
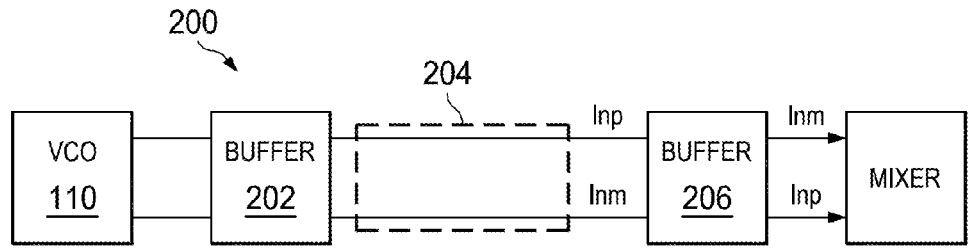
FIG. 2 illustrates a system configuration of a differential buffer in accordance with various embodiments of the present disclosure.

FIG. 2 illustrates a system configuration of a differential buffer in accordance with various embodiments of the present disclosure. As shown in FIG. 2, the local oscillator 110 is coupled to a mixer (e.g., the mixer 107 shown in FIG. 1) through a first buffer 202, a differential pair of lines 204 and a second buffer 206.

The local oscillator 110 may generate a first differential signal and a second differential signal and send both differential signals to a first buffer 202. The mixer may be far away from the local oscillator 110 in an integrated circuit layout. In order to have noise-free signals fed into the mixer, the differential pair of lines 204 may be employed to carry the first differential signal and the second differential signal. In addition, the second buffer 206 may be employed to enhance the first differential signal and the second differential signal so as to improve the phase balance between the two differential signals.

In some embodiments, the differential pair of lines 204 may comprise two complementary transmission lines that transfer opposite signals. In a layout, the differential pair of lines 204 may be implemented as a pair of tightly coupled layout traces. One trace may carry a positive signal Inp. The other may carry an equal but opposite signal such as Inm as shown in FIG. 2. The differential pair of lines 204 may function as two transmission lines. The signal generated in the VCO tank inductor of the local oscillator 110 may be inductively coupled into the two transmission lines and corrupt the phase of the differential pair of signals carried on the two transmission lines. As a result, there may be a phase mismatch at the inputs of the second buffer 206. The phase mismatch may be corrected through two feedback capacitors (not shown but illustrated in FIG. 3 and FIG. 4). The detailed schematic diagram of the buffer with phase correction will be described below with respect to FIG. 3 and FIG. 4.

Figure 3:
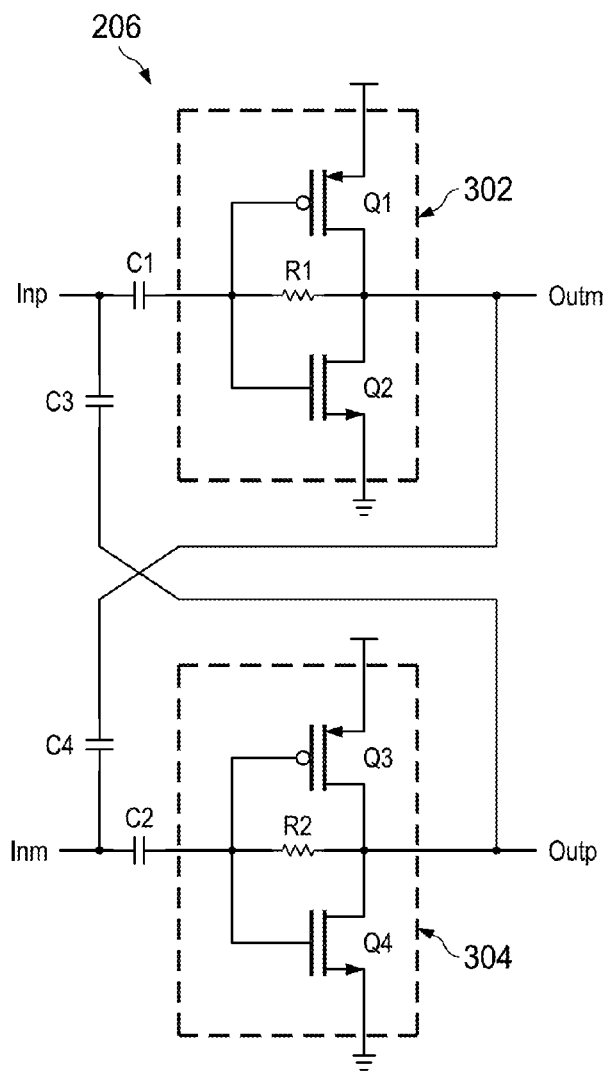
FIG. 3 illustrates a first illustrative implementation of the second buffer shown in FIG. 2 in accordance with various embodiments of the present disclosure.

FIG. 3 illustrates a first illustrative implementation of the second buffer shown in FIG. 2 in accordance with various embodiments of the present disclosure. The second buffer 206 may comprise a first inverter 302, a second inverter 304, a first input capacitor C1, a second input capacitor C2, a first feedback capacitor C3 and a second feedback capacitor C4. It should be noted that the inverters used in FIG. 3 are selected purely for demonstration purposes and are not intended to limit the various embodiments of the present invention to any type or any number of inverters. One of ordinary skill in the art would recognize many variations, alternatives, and modifications. For example, the first inverter 302 may be replaced by a plurality of inverters connected in cascade.

The first inverter 302 comprises a first transistor Q1 and a second transistor Q2 connected in series between a power supply and ground. In some embodiments, the first transistor Q1 is a PMOS transistor. The second transistor Q2 is an NMOS transistor. The gate of the first transistor Q1 and the gate of the second transistor Q2 are connected together. The common node of the gate of the first transistor Q1 and the gate of the second transistor Q functions as an input of the first inverter 302. As shown in FIG. 3, the input of the first inverter 302 is coupled to a first input Inp of the second buffer 206 through a first input capacitor C1. The first input capacitor C1 functions as an input dc blocking capacitor according to some embodiments.

As shown in FIG. 3, the source of the first transistor Q1 is coupled to the power supply. The drain of the first transistor Q1 and the drain of the second transistor Q2 are connected together. The common node of the drain of the first transistor Q1 and the drain of the second transistor Q2 functions as an output of the first inverter 302. There may be a resistor R1 coupled between the input and the output of the first inverter 302. The resistor R1 functions as a biasing resistor for the first inverter 302.

The second inverter 304 is of a structure similar to that of the first inverter 302, and hence is not discussed in detail herein to avoid unnecessary repetition. In order to correct the phase mismatch between the first inverter 302 and the second inverter 304, two feedback capacitors C3 and C4 are employed as shown in FIG. 3. A first feedback capacitor C3 is coupled between the first input Inp and the output of the second inverter 304. Likewise, a second feedback capacitor C4 is coupled between a second input Inm and the output of the first inverter 302.

In some embodiments, the first feedback capacitor C3 and the second feedback capacitor C4 provide positive feedback signals to the first inverter 302 and the second inverter 304 respectively. The capacitances of the feedback capacitors C3 and C4 are so selected that the positive feedback signals help to correct the phase mismatch between two inverters without causing instability of the second buffer 206. In other words, the capacitors of the feedback capacitors C3 and C4 are sized for phase imbalance correction while maintaining frequency stability.

In some embodiments, the capacitance of the first input capacitor C1 is greater than the capacitance of the first feedback capacitor C3. Likewise, the capacitance of the second input capacitor C2 is greater than the capacitance of the second feedback capacitor C4. In some embodiments, the capacitance of C3 is equal to the capacitance of C4. One advantageous feature of the second buffer 206 shown in FIG. 3 is that the feedback capacitors C3 and C4 may help to reduce the power consumption of a transceiver. In some embodiments, the total transceiver power consumption may be reduced by 10%.

In some embodiments, the second buffer 206 may be included in a quadrature generator (not shown). The quadrature generator is capable of operating at many different frequencies and may operate at 5.38 GHz. By employing the feedback mechanism shown in FIG. 3, the output quadrature phase imbalance is about −5.54 degrees. On the other hand, without the feedback capacitors and under the same operating condition, the output quadrature phase imbalance is about −10.3 degrees. In summary, the feedback capacitors C3 and C4 help to reduce the phase imbalance of the second buffer 206. In particular, the phase imbalance may be reduced by 50%.

Figure 4:
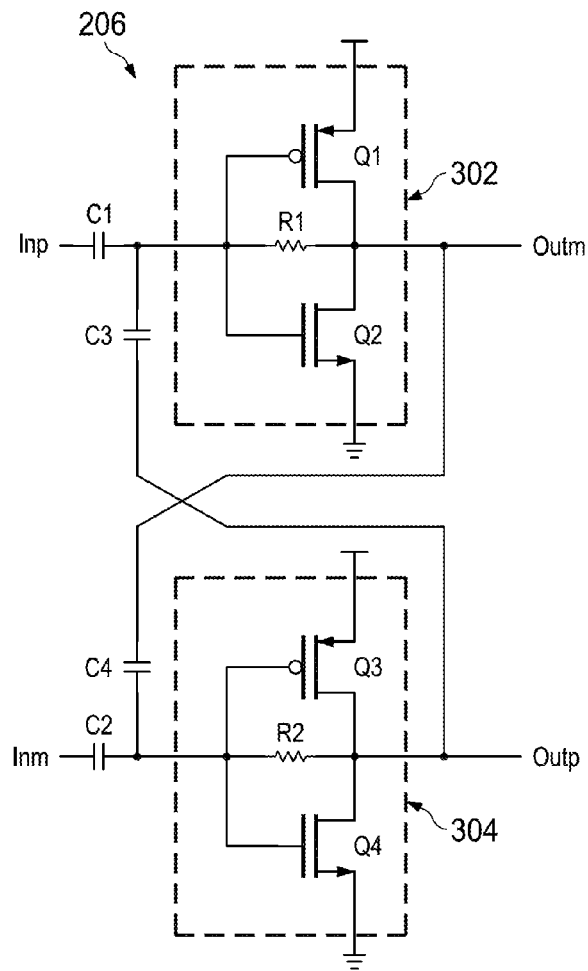
FIG. 4 illustrates a second illustrative implementation of the second buffer shown in FIG. 2 in accordance with various embodiments of the present disclosure.

FIG. 4 illustrates a second illustrative implementation of the second buffer shown in FIG. 2 in accordance with various embodiments of the present disclosure. The schematic diagram of the second illustrative implementation of the second buffer 206 is similar to that shown in FIG. 3 except that the configuration of the feedback capacitors C3 and C4 is slightly different. As shown in FIG. 4, the first feedback capacitor C3 is coupled between the output of the second inverter 304 and the input of the first inverter 302. Likewise, the second feedback capacitor C4 is coupled between the output of the first inverter 302 and the input of the second inverter 304.

Figure 5:
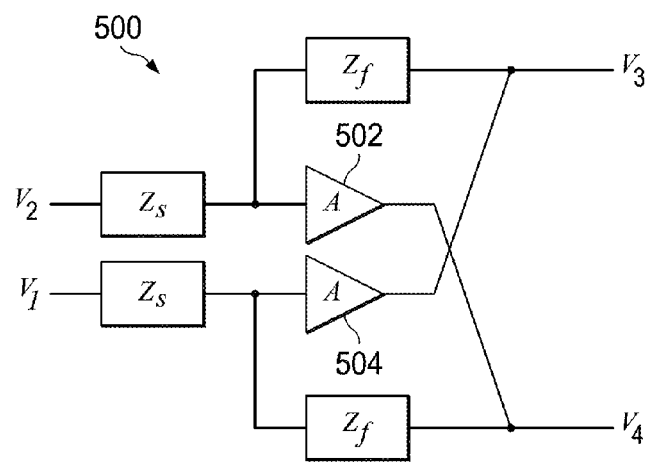
FIG. 5 illustrates a system block diagram of the second buffer shown in FIG. 2 in accordance with various embodiments of the present disclosure.

FIG. 5 illustrates a system block diagram of the second buffer shown in FIG. 2 in accordance with various embodiments of the present disclosure. The system 500 includes a first buffer 502 and a second buffer 504. As shown in FIG. 5, the first buffer 502 has an input terminal V1 and an output terminal V4. The output terminal V4 is coupled to the input of the second buffer 504 through a feedback element $Z_f$. Likewise, the second buffer 504 has an input terminal V2 and an output terminal V3. The output terminal V3 is coupled to the input of the first buffer 502 through another feedback element $Z_f$.

In order to obtain the transfer equations of the first buffer 502 and the second buffer 504, $H_s(j\omega)$ and $H_j(j\omega)$ are defined as follows:

$$H_s(j\omega) = \frac{Z_j(j\omega)}{Z_j(j\omega) + Z_s(j\omega)} \quad (1)$$

$$H_j(j\omega) = \frac{Z_s(j\omega)}{Z_j(j\omega) + Z_s(j\omega)} \quad (2)$$

In some embodiments, the first buffer 502 and the second buffer 504 may be an inverting amplifier, which has a gain $A(j\omega)$. The transfer equations of the first buffer 502 and the second buffer 504 may be expressed as:

$$V_3(j\omega) = \left[\frac{A(j\omega)H_s(j\omega)}{1 - A^2(j\omega)H_f^2(j\omega)}\right][V_1(j\omega) + V_2(j\omega)A(j\omega)H_f(j\omega)] \quad (3)$$

$$V_4(j\omega) = \left[\frac{A(j\omega)H_s(j\omega)}{1 - A^2(j\omega)H_f^2(j\omega)}\right][V_2(j\omega) + V_1(j\omega)A(j\omega)H_f(j\omega)] \quad (4)$$

In some embodiments, the differential gain of the system 500 may be given by the following equation:

$$\frac{V_4(j\omega) - V_3(j\omega)}{V_2(j\omega) - V_1(j\omega)} = -\left[\frac{A(j\omega)H_s(j\omega)}{1 + A(j\omega)H_f(j\omega)}\right] \quad (5)$$

In some embodiments, the relative magnitude and phase of the differential output's signals may be given by the following equation:

$$\frac{V_4(j\omega)}{V_3(j\omega)} = -1 + j0 = \left[\frac{\left(\frac{V_2(j\omega)}{V_1(j\omega)}\right) + A(j\omega)H_f(j\omega)}{1 + \left(\frac{V_2(j\omega)}{V_1(j\omega)}\right)A(j\omega)H_f(j\omega)}\right] \quad (6)$$

In some embodiments, the ideal output of the system 500 is differential. Such a differential output can be achieved if the following condition is satisfied:

$$\frac{V_4(j\omega)}{V_3((j\omega)} = 1\angle 180° = -1 + j0 = \left[\frac{\left(\frac{V_2(j\omega)}{V_1(j\omega)}\right) + A(j\omega)H_f(j\omega)}{1 + \left(\frac{V_2(j\omega)}{V_1(j\omega)}\right)A(j\omega)H_f(j\omega)}\right] \quad (7)$$

Based upon Equation (7) above, the feedback of the system 500 can be simplified as:

$$A(j\omega)H_f(j\omega) = -1 + j0 \quad (8)$$

The feedback of the system 500 can be expressed as the following by solving Equation (8) above.

$$H_f(j\omega) = \frac{A^*(j\omega)}{|A(j\omega)|^2} \quad (9)$$

The ideal solution shown in Equation (9) may be an oscillator since the open loop gain of the system 500 may be given by the following equation:

$$[A(j\omega)H_f(j\omega)]^2 = 1\angle 0° \quad (10)$$

In order to find a non-oscillatory solution for an input imbalance at Wo, assume V1 and V2 satisfy the following equation:

$$\frac{V_2(j\omega_o)}{V_1(j\omega_o)} = a + jb \quad (11)$$

The required feedback of the system 500 may be defined as:

$$A(j\omega_0)H_f(j\omega_0) = x + jy \quad (12)$$

The appropriate phase balance may be expressed as:

$$\frac{V_4(j\omega)}{V_3(j\omega)} = m\angle 180° = -m + j0 = \left[\frac{(a + jb) + (x + jy)}{1 + (a + jb)(x + jy)}\right] \quad (13)$$

where m indicates an amplitude balance for the ideal phase balance.

The appropriate phase balance level may be obtained through solving the real part of Equation (13).

$$m = -\left[\frac{(a + x)(1 + ax - by) + (b + y)(ay + bx)}{(1 + ax - by)^2 + (ay + bx)^2}\right] \quad (14)$$

In addition, the appropriate phase balance can be found by solving the imaginary part of Equation (13):

$$j0 = j[(1 + ax - by)(b + y) - (a + x)(ay + bx)] \quad (15)$$

Since the inverting amplifier (e.g., buffers 502 and 504) may have 180 degrees of phase shift plus some phase shift associated with its frequency response, the feedback of the system 500 may be expressed as:

$$\angle[A(j\omega_o)H_f(j\omega_o)] = \phi \neq 180° \quad (16)$$

From Equation (12):

$$x = \frac{y}{\text{Tan}[\phi]} \quad (17)$$

The following equations may be obtained for solving the imaginary part of Equation (12).

$$0 = \left(b - \frac{1}{\text{Tan}^2(\phi)}\right)y^2 + (a^2 + b^2 - 1)y - b \quad (18)$$

$$y = -\left[\frac{(a^2 + b^2 - 1) \pm \sqrt{(a^2 + b^2 - 1)^2 + 4b^2\left(1 + \frac{1}{\text{Tan}^2(\phi)}\right)}}{2b\left(1 + \frac{1}{\text{Tan}^2(\phi)}\right)}\right] \quad (19)$$

The real part of Equation (12) is solved from y and Equation (17).

The following equations may be obtained for solving the magnitude balance, which is the real part of Equation (13).

$$m = -\left[\frac{(a + x)(1 + ax - by) + (b + y)(ay + bx)}{(1 + ax - by)^2 + (ay + bx)^2}\right] \quad (20)$$

It should be noted that Equation (20) is a non-oscillatory solution. In other words, Equation (20) indicates the following:

$$|A(j\omega_o)H_f(j\omega_o)| < 1 \qquad (21)$$

The closer φ in Equation (19), is to 180 degrees, the closer m, in Equation (20), is to 1, and the larger the differential gain. The design of the feedback of the system 500 depends on the magnitude and phase of the input signal at the input of the system 500. It should be noted that an improper feedback design may cause the phase imbalance to be worse at the outputs of the system 500.

Figure 6:
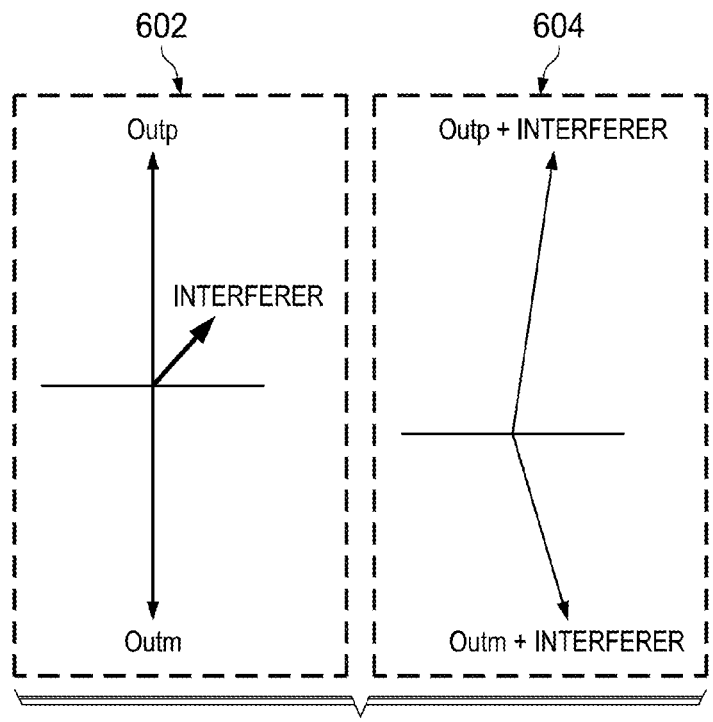
FIG. 6 illustrates vector diagrams of a buffer without phase correction in accordance with various embodiments of the present disclosure.

FIG. 6 illustrates vector diagrams of a buffer without phase correction in accordance with various embodiments of the present disclosure. As shown in a first vector diagram 602, there may be an interferer in a buffer without phase correction. Without the feedback mechanisms shown in FIG. 3 and FIG. 4, the buffer is not able to reduce the impact from the interferer. As a result, the combination of the differential signals (e.g., differential signals Outp and Outm) and the interferer may result in non-differential signals as shown in a second vector diagram 604.

Figure 7:
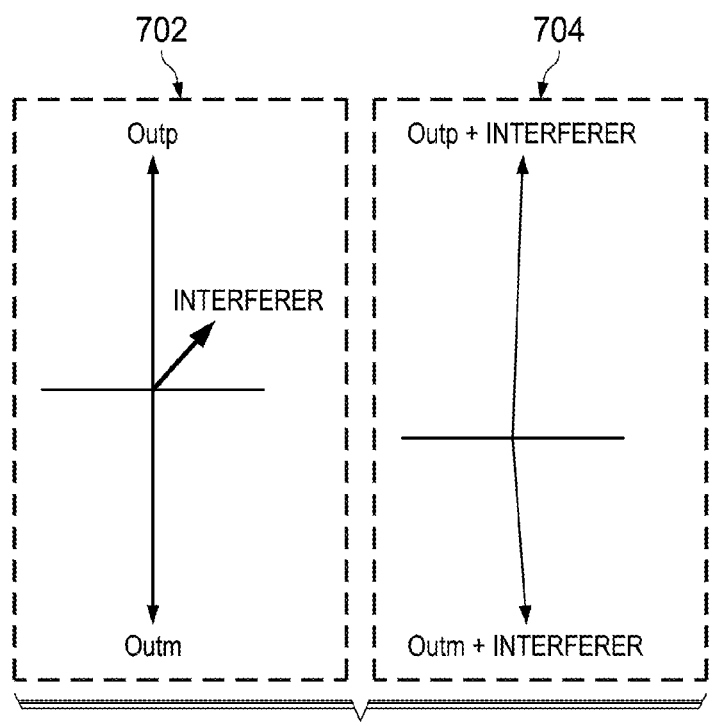
FIG. 7 illustrates vector diagrams of a buffer with phase correction in accordance with various embodiments of the present disclosure.

FIG. 7 illustrates vector diagrams of a buffer with phase correction in accordance with various embodiments of the present disclosure. As shown in a first vector diagram 702, there may be an interferer in a buffer with phase correction. As described above with respect to FIGS. 3-5, the feedback mechanisms shown in FIG. 3 and FIG. 4 are able to reduce the impact from the interferer as shown in a second vector diagram 704.

Figure 8:
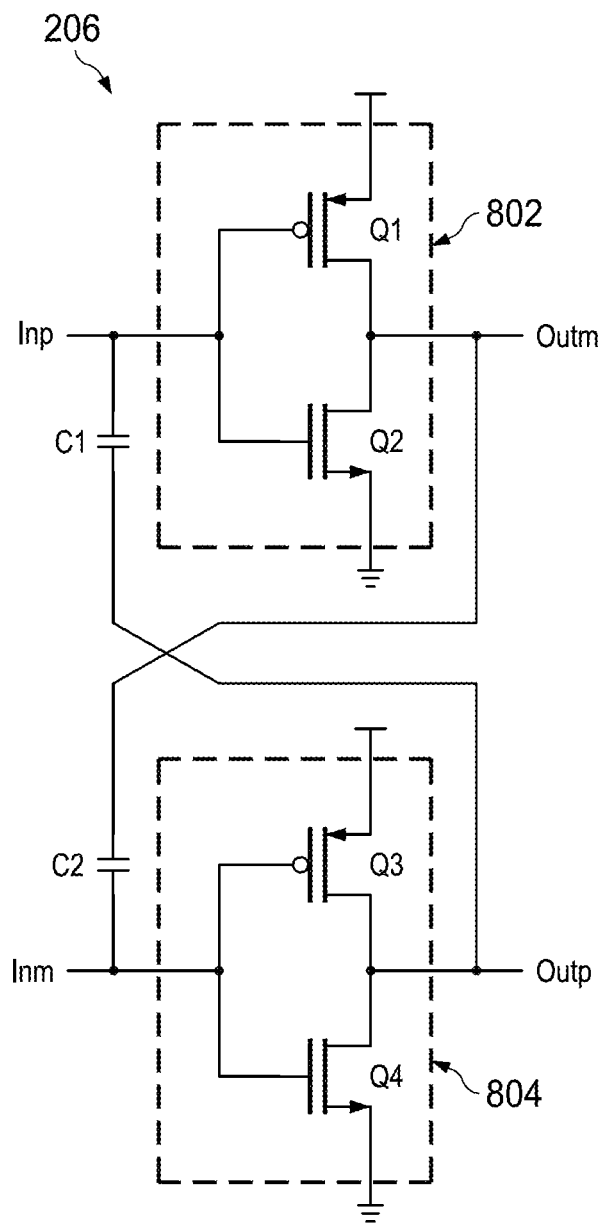
FIG. 8 illustrates a third illustrative implementation of the second buffer shown in FIG. 2 in accordance with various embodiments of the present disclosure.

FIG. 8 illustrates a third illustrative implementation of the second buffer shown in FIG. 2 in accordance with various embodiments of the present disclosure. The schematic diagram of the third illustrative implementation of the second buffer 206 is similar to those shown in FIG. 3 and FIG. 4 except that the second buffer 206 shown in FIG. 8 does not include input capacitors and biasing resistors. As shown in FIG. 8, the signal Inp is directly connected to the input of the first inverter 802. Likewise, the signal Inm is directly connected to the input of the second inverter 804. In addition, the first inverter 802 does not include a biasing resistor coupled between the input and the output of the first inverter 802. The second inverter 804 does not include a biasing resistor coupled between the input and the output of the second inverter 804.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
a first inverter coupled between a first input terminal and a first output terminal, wherein the first inverter comprises:
a first transistor and a second transistor connected in series between a power supply and ground, wherein a first gate of the first transistor and a second gate of the second transistor are connected to an input of the first inverter;
a second inverter coupled between a second input terminal and a second output terminal;
a first feedback capacitor coupled between the input of the first inverter and the second output terminal; and
a second feedback capacitor coupled between an input of the second inverter and the first output terminal.

2. The apparatus of claim 1, wherein the second inverter comprises:
a third transistor and a fourth transistor connected in series between the power supply and ground, wherein:
a third gate of the third transistor and a fourth gate of the fourth transistor are connected to the input of the second inverter; and
a common node of the third gate and the fourth gate is coupled to the second input terminal.

3. The apparatus of claim 2, further comprising:
a first input capacitor coupled between the first input terminal and the input of the first inverter; and
a second input capacitor coupled between the second input terminal and the input of the second inverter.

4. The apparatus of claim 3, further comprising:
a first resistor coupled between the input of the first inverter and the first output terminal; and
a second resistor coupled between the input of the second inverter and the second output terminal.

5. The apparatus of claim 4, wherein:
the first feedback capacitor is coupled between the first input terminal and the second output terminal; and
the second feedback capacitor is coupled between the second input terminal and the first output terminal.

6. The apparatus of claim 4, wherein:
the first feedback capacitor is coupled between the second output terminal and the input of the first inverter; and
the second feedback capacitor is coupled between the first output terminal and the input of the second inverter.

7. The apparatus of claim 6, wherein:
a capacitance of the first input capacitor is greater than a capacitance of the first feedback capacitor; and
a capacitance of the second input capacitor is greater than a capacitance of the second feedback capacitor.

8. A system comprising:
a mixer configured to receive a radio frequency signal from an antenna and a frequency translating signal from a local oscillator; and
a buffer coupled to the mixer and connected to the local oscillator through a differential pair of lines, wherein the buffer comprises:
a first inverter formed by two transistors connected in series;
a first resistor coupled between an input of the first inverter and an output of the first inverter;
a first input capacitor coupled between a first input terminal of the buffer and the input of the first inverter;
a second inverter formed by two transistors connected in series;
a second resistor coupled between an input of the second inverter and an output of the second inverter;

a second input capacitor coupled between a second input terminal of the buffer and the input of the second inverter;

a first feedback capacitor coupled between the input of the first inverter and the output of the second inverter; and a second feedback capacitor coupled between the input of the second inverter and the output of the first inverter.

9. The system of claim 8, wherein the first inverter comprises:

a first transistor and a second transistor connected in series between a power supply and ground, wherein a first gate of the first transistor and a second gate of the second transistor are connected to the input of the first inverter.

10. The system of claim 9, wherein:

the first transistor is a PMOS transistor; and
the second transistor is an NMOS transistor.

11. The system of claim 10, wherein the second inverter comprises:

a third transistor and a fourth transistor connected in series between the power supply and ground, wherein a third gate of the third transistor and a fourth gate of the fourth transistor are connected to the input of the second inverter.

12. The system of claim 11, wherein:

the third transistor is a PMOS transistor; and
the fourth transistor is an NMOS transistor.

13. The system of claim 12, further comprising:

a second buffer coupled between the local oscillator and the differential pair of lines.

14. A method comprising:

generating a differential pair of signals from a local oscillator, wherein the differential pair of signals includes a first signal and a second signal;

applying the first signal and the second signal to a first inverter and a second inverter of a buffer respectively through a differential pair of lines;

applying a first positive feedback signal to the first inverter through a first feedback capacitor, wherein the first positive feedback signal is generated from an output of the second inverter; and applying a second positive feedback signal to the second inverter through a second feedback capacitor, wherein the second positive feedback signal is generated from an output of the first inverter.

15. The method of claim 14, wherein the buffer comprises:

the first inverter formed by two transistors connected in series;

a first resistor coupled between an input of the first inverter and the output of the first inverter;

a first input capacitor coupled between a first input terminal of the buffer and the input of the first inverter;

the second inverter formed by two transistors connected in series;

a second resistor coupled between the input of the second inverter and the output of the second inverter;

a second input capacitor coupled between a second input terminal of the buffer and the input of the second inverter;

the first feedback capacitor coupled between the input of the first inverter and the output of the second inverter; and the second feedback capacitor coupled between the output of the first inverter and the input of the second inverter.

16. The method of claim 15, further comprising:

applying the first positive feedback signal to the input of the first inverter through the first feedback capacitor, wherein the first input capacitor is coupled between the first input terminal of the buffer and the input of the first inverter; and applying the second positive feedback signal to the input of the second inverter through the second feedback capacitor, wherein the second input capacitor is coupled between the second input terminal of the buffer and the input of the second inverter.

17. The method of claim 15, further comprising:

applying the first positive feedback signal to the first input terminal of the buffer through the first feedback capacitor, wherein the first input capacitor is coupled between the first input terminal of the buffer and the input of the first inverter; and applying the second positive feedback signal to the second input terminal of the buffer through the second feedback capacitor, wherein the second input capacitor is coupled between the second input terminal of the buffer and the input of the second inverter.

18. The method of claim 14, wherein:

the first inverter is formed by a first PMOS transistor and a first NMOS transistor connected in series between a power supply and ground.

19. The method of claim 18, wherein:

the second inverter is formed by a second PMOS transistor and a second NMOS transistor connected in series between the power supply and ground.

20. The method of claim 14, wherein:

a capacitance of the first feedback capacitor is equal to a capacitance of the second feedback capacitor.

* * * * *